(12) United States Patent
Naito (10) Patent No.: US 8,482,022 B2
(45) Date of Patent: Jul. 9, 2013

(54) LIGHT-EMITTING DEVICE

(75) Inventor: Katsuyuki Naito, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/426,754

(22) Filed: Mar. 22, 2012

(65) Prior Publication Data
US 2012/0241796 A1 Sep. 27, 2012

(30) Foreign Application Priority Data
Mar. 25, 2011 (JP) .................................. 2011-068671

(51) Int. Cl.
*H01L 33/00* (2010.01)
(52) U.S. Cl.
USPC ................................ 257/98; 257/82; 257/432
(58) Field of Classification Search
USPC ................... 257/E33.067, 98, 79, 80, 81, 82, 257/84, 85, 88, 89, 90, 431, 432
See application file for complete search history.

(56) References Cited

U.S. PATENT DOCUMENTS

| | | | |
|---|---|---|---|
| 2006/0183034 A1* | 8/2006 | Misaka | 430/5 |
| 2009/0134416 A1* | 5/2009 | Lee | 257/98 |
| 2009/0230415 A1* | 9/2009 | Ide et al. | 257/98 |

FOREIGN PATENT DOCUMENTS

| | | |
|---|---|---|
| JP | 03-155090 | 7/1991 |
| JP | 10-91087 | 4/1998 |
| JP | 2004-271830 | 9/2004 |
| JP | 2004-273243 | 9/2004 |
| JP | 2008-210570 | 9/2008 |
| JP | 2009-099400 | 5/2009 |
| JP | 2010-528407 | 8/2010 |
| JP | 2010-282729 | 12/2010 |
| WO | WO 2008/053537 A1 | 5/2008 |

OTHER PUBLICATIONS

Notice of Reasons for Rejection for counterpart Japanese Application No. 2011-068671, mailed Apr. 23, 2013 (3 pages).

* cited by examiner

*Primary Examiner* — Thanh Y Tran
(74) *Attorney, Agent, or Firm* — Finnegan, Henderson, Farabow, Garrett & Dunner, LLP (57) ABSTRACT

According to one embodiment, a light-emitting device includes a light-transmitting layer including first and second regions and a third region intervening therebetween, and a light-emitting portion overlapping the second region or the second and third regions. A first portion of the device corresponding to the first region transmits light having a certain wavelength in a visible range at a first transmittance. A second portion of the device corresponding to the second region causes emission by the light-emitting portion and transmits the light at a second transmittance lower than the first transmittance. A third portion of the device corresponding to the third region is configured to have a transmittance distribution in which transmittance for the light decreases from an end on a first portion's side to an end on a second portion's side within a range from the first transmittance to the second transmittance.

17 Claims, 6 Drawing Sheets

F I G. 9

LIGHT-EMITTING DEVICE

CROSS-REFERENCE TO RELATED APPLICATION

This application is based upon and claims the benefit of priority from prior Japanese Patent Application No. 2011-068671, filed Mar. 25, 2011, the entire contents of which are incorporated herein by reference.

FIELD

Embodiments described herein relate generally to a light-emitting device.

BACKGROUND

An organic electroluminescent (to be referred to as EL hereinafter) device has recently received a great deal of attention as a display device or an illumination device.

When an organic EL device is applied to a display device, the light-emitting element can be used as a display element. For this reason, such a display device features a wide viewing angle, thin and lightweight body, low power consumption, and fast response as compared to a liquid crystal display device. In addition, the organic EL device that is a display device or an illumination device can be installed in various places. Furthermore, the organic EL device can transmit light when using light-transmitting electrodes as both the cathode and the anode. Hence, various applications have been examined for the organic EL device.

DETAILED DESCRIPTION

In general, according to one embodiment, a light-emitting device comprises a light-transmitting layer including first and second regions and a third region intervening therebetween, and a light-emitting portion overlapping the second region or the second and third regions. A first portion of the light-emitting device that corresponds to the first region transmits light having a certain wavelength in a visible range at a first transmittance. A second portion of the light-emitting device that corresponds to the second region causes light emission by the light-emitting portion and transmits the light having the wavelength at a second transmittance lower than the first transmittance. A third portion of the light-emitting device that corresponds to the third region is configured to have a transmittance distribution in which transmittance for the light having the wavelength decreases from an end on a side of the first portion to an end on a side of the second portion within a range from the first transmittance to the second transmittance.

A light-emitting device according to another embodiment comprises a light-transmitting layer including a first region and a second region surrounded by the first region, and a light-emitting portion adhered to the second region. The first region has an area larger than that of the second region. The light-transmitting layer comprises first and second substrates facing each other, an optical variable layer intervening between the first substrate and the second substrate and causing an optical characteristic change thereof in accordance with a magnitude of an applied voltage, one or more first electrodes intervening between the first substrate and the second substrate, and a second electrode intervening between the first and second substrates and applying the voltage to the optical variable layer together with said one or more first electrodes. The light-transmitting layer is configured to, in at least a part thereof, change transmittance for light having a certain wavelength in a visible range in accordance with the magnitude and/or a direction of the voltage applied between the second electrode and each of said one or more first electrodes. The light-emitting portion transmits the light having the wavelength.

Various embodiments will be described below with reference to the drawings. In the drawings, the same reference characters denote components having the same or similar functions and duplicates descriptions will be omitted.

A light-emitting device according to the first embodiment is usable as, for example, a smart window or a part thereof. More specifically, the light-emitting device according to the first embodiment is used as, for example, a window member or bonded to a window member such as a windowpane. Alternatively, the light-emitting device according to the first embodiment is a structure which includes a window member and a window frame and is directly attachable to an opening of a wall. The light-emitting device according to the first embodiment will be described with reference to FIGS. 1 to 4.

Figure 1:
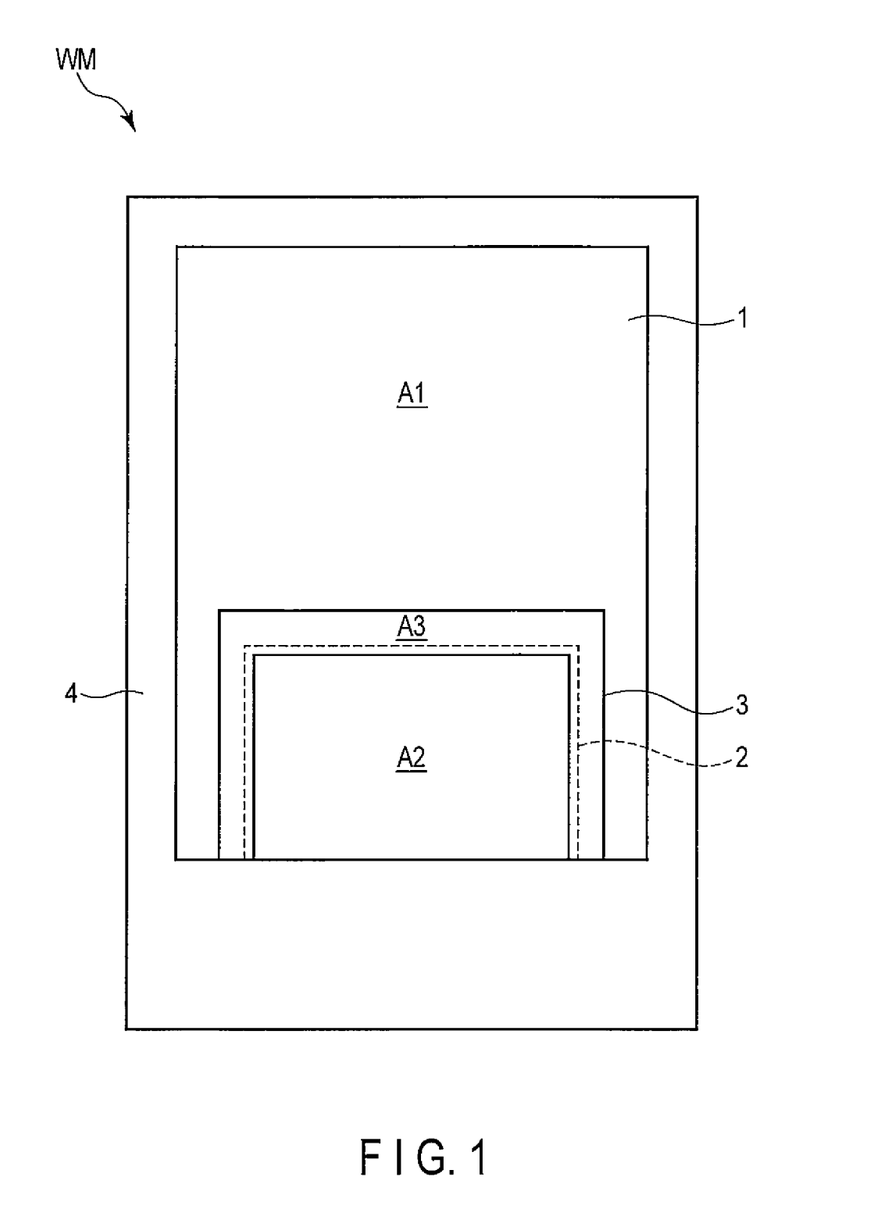
FIG. 1 is a plan view schematically showing a light-emitting device according to the first embodiment.
Figure 4:
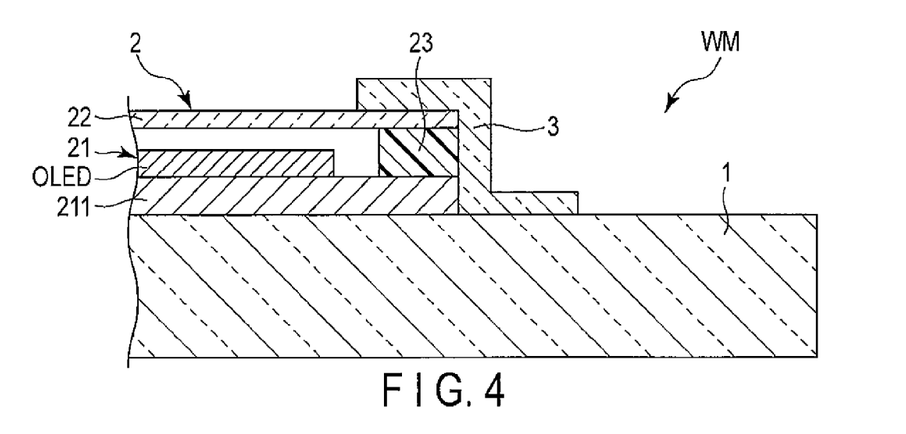
FIG. 4 is a sectional view of the light-emitting device shown in FIG. 1.

A light-emitting device WM shown in FIGS. 1 and 4 includes a light-transmitting layer 1, a light-emitting portion 2, an optical adjustment layer 3, a frame 4, and a controller (not shown).

The light-transmitting layer 1 is a light control device capable of electrically controlling the transmittance for a light component having a given wavelength in the visible range, typically, for the light components of all wavelengths in the visible range. Here, the light-transmitting layer 1 is an electrochromic light control device that can reversibly change between a transparent state and a colored state. Note that out of terms concerning light, the terms to be used with a specific wavelength such as "light-transmitting", "transparent", and "transmittance" are used for light having a specific wavelength in the visible range, for example, light having a wavelength of 550 nm that is highly visible to human unless otherwise specified.

Figure 2:
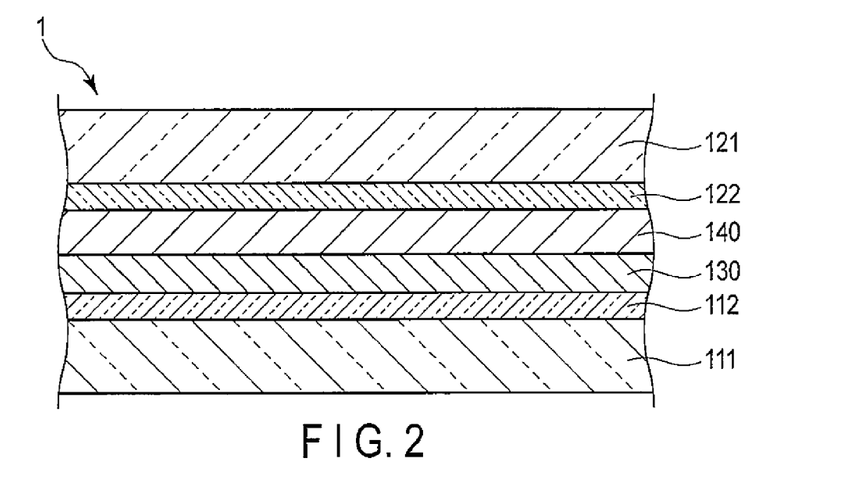
FIG. 2 is a sectional view schematically showing an example of a light-transmitting layer usable in the light-emitting device shown in FIG. 1.

As shown in FIG. 2, the light-transmitting layer 1 includes a first substrate 111, a second substrate 121, a first electrode 112, a second electrode 122, an electrolytic layer 130, and an electrochromic layer 140.

The substrates 111 and 121 are arranged to face each other.

The substrates 111 and 121 are light-transmitting substrates, for example, transparent substrates. The substrates 111 and 121 typically exhibit light transmittance to the light components of all wavelengths in the visible range. For example, the substrates 111 and 121 are transparent to the light components of all wavelengths in the visible range. The substrates 111 and 121 can be either colorless or colored.

The substrates 111 and 121 are made of an insulating material such as glass, quartz, or a resin. The substrates 111 and 121 can be either rigid or flexible. Each of the substrates 111 and 121 can have either a single-layer structure or a multilayer structure.

The electrodes 112 and 122 are provided on the opposing faces of the substrates 111 and 121, respectively. The electrodes 112 and 122 are light-transmitting electrodes, for example, transparent electrodes. The electrodes 112 and 122 typically exhibit light transmittance to the light components of all wavelengths in the visible range. For example, the electrodes 112 and 122 are transparent to the light components of all wavelengths in the visible range. The electrodes 112 and 122 can be either colorless or colored.

The electrodes 112 and 122 are made of, for example, indium tin oxide (ITO), nitrogen- or boron-substituted graphene, or unsubstituted graphene. The layer made of substituted or unsubstituted graphene is flexible and hard to transmit water or oxygen. Hence, when the substrates 111 and 121 made of, for example, a resin are used, substituted or unsubstituted graphene is preferably used as the material of the electrodes 112 and 122.

The electrolytic layer 130 intervenes between the electrodes 112 and 122. The electrolytic layer 130 is formed of, for example, a composition containing a polar solvent and a supporting electrolyte dissolved in it. A solid electrolyte may be used as the material of the electrolytic layer 130.

The electrochromic layer 140 intervenes between the electrode 122 and the electrolytic layer 130. The electrochromic layer 140 forms, together with the electrolytic layer 130, an optical variable layer whose optical characteristics change in accordance with the magnitude of the applied voltage. As the material of the electrochromic layer 140, for example, a reduction coloring material such as $V_2O_5$, $Nb_2O_5$, $TiO_2$ or $WO_3$, or an oxidation coloring material such as NiO, $Cr_2O_3$, $MnO_2$, or CoO is usable.

The light-transmitting layer 1 changes the transmittance depending on the direction of a voltage applied between the electrodes 112 and 122. For example, in the case of using a reduction coloring material as the material of the electrochromic layer 140, the light-transmitting layer 1 changes to transparent when a voltage is applied such that the electrodes 112 and 122 become negative and positive, respectively. In this case, the light-transmitting layer 1 is colored darker by applying a voltage such that the electrodes 112 and 122 become positive and negative, respectively.

The light-emitting portion 2 is a flat panel display device incorporating at least one light source and capable of changing the display image, more specifically, an organic EL display device using an active matrix driving method. The light-emitting portion 2 can display either a full-color image or a monochrome image. Alternatively, the light-emitting portion 2 may be an illumination device.

As shown in FIGS. 1 and 4, the light-emitting portion 2 overlaps a part of the light-transmitting layer 1. The position of the light-emitting portion 2 is fixed with respect to the light-emitting layer 1. For example, the light-emitting portion 2 is adhered to one major surface of the light-transmitting layer 1.

Note that the first region is the region of the light-transmitting layer 1 that does not overlap the light-emitting portion 2 or a part of the region. The second region is the region of the light-transmitting layer 1 that overlaps the light-emitting portion 2 or a part of the region. The third region is the region of the light-transmitting layer 1 that is located between the first region and the second region. Portions A1 to A3 of the light-emitting device WM that correspond to the first to third regions are the first to third portions, respectively.

Figure 3:
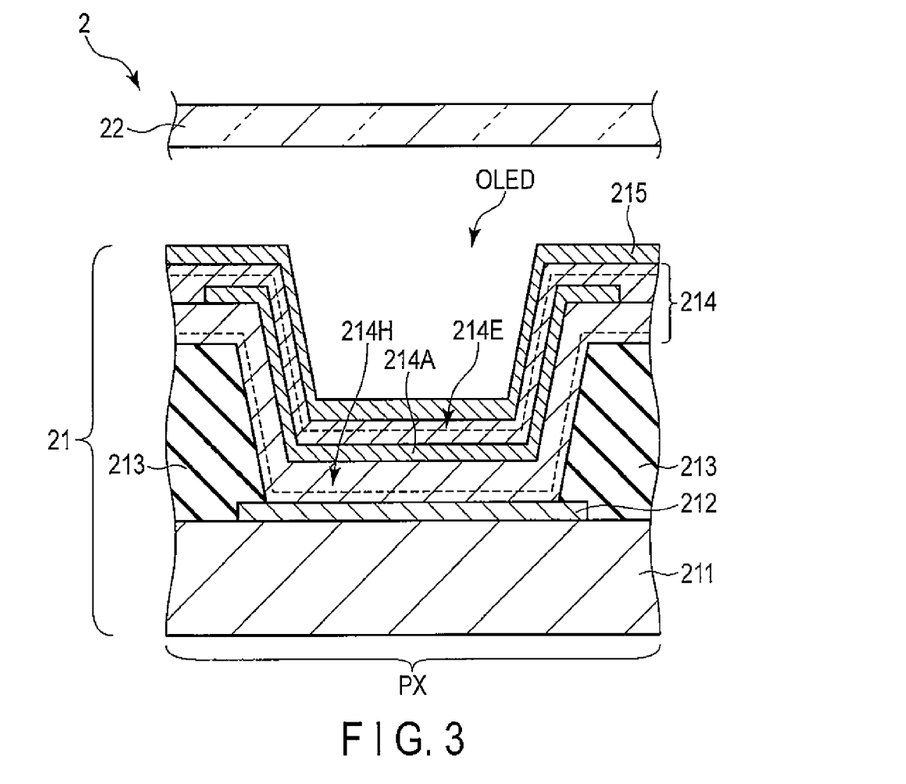
FIG. 3 is a sectional view schematically showing an example of a light-emitting portion usable in the light-emitting device shown in FIG. 1.

As shown in FIGS. 3 and 4, the light-emitting portion 2 includes an array substrate 21, a sealing substrate 22, and a seal layer 23 intervening between them. As shown in FIG. 4, the light-emitting portion 2 is arranged such that the surface on the side of the array substrate 21 faces the light-transmitting layer 1. The light-emitting portion 2 may be arranged such that the surface on the side of the sealing substrate 22 faces the light-transmitting layer 1.

As shown in FIG. 3, the array substrate 21 includes a third substrate 211, anodes 212, a partition insulating layer 213, an active layer 214, and a cathode 215.

The array substrate 21 includes the insulating substrate 211 and a circuit formed on one major surface thereof.

The insulating substrate 211 is a light-transmitting substrate, for example, a transparent substrate. The insulating substrate typically exhibits light transmittance to the light components of all wavelengths in the visible range. For example, the insulating substrate is transparent to the light components of all wavelengths in the visible range. The insulating substrate 211 can be either colorless or colored. The insulating substrate 211 is made of an insulating material such as glass, quartz, or a resin. An insulating substrate made of a resin is normally more lightweight than an insulating substrate made of glass or quartz. Using a resin allows to make the insulating substrate flexible. The insulating substrate can have either a single-layer structure or a multilayer structure.

The circuit includes pixel circuits arranged in a matrix, scanning lines, signal lines, power supply lines, and arbitrary peripheral circuits. If the light-emitting portion 2 is an illumination device, these circuits can be omitted.

The anodes 212 are arrayed on the insulating substrate 211 in correspondence with the pixel circuits. Each anode 212 is a light-transmitting electrode, for example, a transparent electrode. The anode 212 typically exhibits light transmittance to the light components of all wavelengths in the visible range. For example, the anode 212 is transparent to the light components of all wavelengths in the visible range. The anode 212 can be either colorless or colored.

The anode 212 is made of, for example, ITO, zinc oxide (ZnO), boron-substituted graphene, or unsubstituted graphene doped with an acid substance.

The boron-substituted graphene or the unsubstituted graphene doped with an acid substance is of a p-type and has a large work function. Hence, when these materials are used as the material of the anode 212, a high hole injection efficiency can be achieved. The boron-substituted graphene or the unsubstituted graphene doped with an acid substance exhibits high transparency and has fewer limitations on the resource. Hence, as the material of the anode 212, the boron-substituted graphene or the unsubstituted graphene doped with an acid substance is preferably used.

The boron-substituted graphene or the unsubstituted graphene doped with an acid substance is flexible and stable to water or oxygen. From this viewpoint as well, when, for example, a resin substrate is used as each of the insulating substrate 211 and the sealing substrate 22, the unsubstituted or substituted graphene is preferably used as the material of the anode 212.

As the unsubstituted or substituted graphene, planar graphene, cylindrical carbon nanotubes, or a mixture thereof can be used. When the unsubstituted or substituted graphene is used, the anode 212 may further contain an additive such as metal nanoparticles, nanowires, or nanorods for improving the conductivity.

As the material of the anode 212, a metal such as silver (Ag), aluminum (Al), iron (Fe), nickel (Ni), copper (Cu), zinc (Zn), gold (Au), or tin (Sn) may also be used. When using a metal, each anode 212 is preferably formed to be thin or have a small area such that the light-emitting portion 2 has a sufficiently high transmittance.

The partition insulating layer 213 is formed on the insulating substrate 211. The partition insulating layer 213 has through-holes at positions corresponding to the anodes 212. That is, the partition insulating layer 213 has a grid shape in this case. The partition insulating layer 213 may have not the through-holes but grooves at positions corresponding to the columns of the anodes 212. That is, the partition insulating layer 213 may have a stripe shape. The partition insulating layer 213 can be formed by, for example, patterning a resin layer.

The active layer 214 covers the upper surfaces of the anodes 212. The active layer 214 further covers the upper surface of the partition insulating layer 213 and the sidewalls of the through-holes provided in it.

The active layer 214 includes a light-emitting layer 214A made of an organic substance or an organometallic complex. When the light-emitting portion 2 adopts a structure capable of displaying a color image, for example, light-emitting layers that run in a direction parallel to the columns of the anodes 212 and emit blue, green, and red light are arrayed in the direction parallel to the rows of the anodes 212.

The active layer 214 further includes layers 214H and 214E. The layer 214H is, for example, a multilayered body including a hole injection layer and a hole-transporting layer. The layer 214E is, for example, a multilayered body including an electron injection layer and an electron-transporting layer. Each of the layers 214E and 214H can further include other layers such as a blocking layer and a buffer layer. One or more of the hole injection layer, the hole-transporting layer, the electron-transporting layer, and the electron injection layer may be omitted. Note that in the active layer 214, the material of the layers other than the light-emitting layer 214A can be either an organic material or an inorganic material.

The cathode 215 covers the active layer 214. The cathode 215 is a light-transmitting electrode, for example, a transparent electrode. The cathode 215 typically exhibits light transmittance to the light components of all wavelengths in the visible range. For example, the cathode 215 is transparent to the light components of all wavelengths in the visible range. The cathode 215 can be either colorless or colored.

The cathode 215 is made of, for example, ITO, zinc oxide (ZnO), nitrogen-substituted graphene, or unsubstituted graphene doped with a basic substance.

The nitrogen-substituted graphene or the unsubstituted graphene doped with a basic substance is of an n-type and has a small work function. Hence, when these materials are used as the material of the cathode 215, a high electron injection efficiency can be achieved. The nitrogen-substituted graphene or the unsubstituted graphene doped with a basic substance exhibits high transparency and has fewer limitations on the resource. Hence, as the material of the cathode 215, the nitrogen-substituted graphene or the unsubstituted graphene doped with a basic substance is preferably used.

The nitrogen-substituted graphene or the unsubstituted graphene doped with a basic substance is flexible and stable to water or oxygen. From this viewpoint as well, when, for example, a resin substrate is used as each of the insulating substrate 211 and the sealing substrate 22, the unsubstituted or substituted graphene is preferably used as the material of the cathode 215.

As the unsubstituted or substituted graphene, planar graphene, cylindrical carbon nanotubes, or a mixture thereof is usable. When the unsubstituted or substituted graphene is used, the cathode 215 may further contain an additive such as metal nanoparticles, nanowires, or nanorods for improving the conductivity.

As the material of the cathode 215, for example, aluminum (Al), silver (Ag), or copper (Cu) may also be used. An alloy containing these metals and magnesium (Mg) and/or calcium (Ca) may be used. When using a metal, the cathode 215 is preferably formed to be thin or have a small area such that the light-emitting portion 2 has a sufficiently high transmittance.

Note that of the multilayered body of the anodes 212, the active layer 214, and the cathode 215, portions corresponding to the anodes 212 form organic EL elements, i.e., organic light-emitting diodes (OLEDs) each serving as a light-emitting element.

The sealing substrate 22 is a fourth substrate. The sealing substrate 22 faces the surface of the array substrate 21 on the side of the cathode 215. The central portion of the sealing substrate 22 is spaced apart from the array substrate 21.

The sealing substrate 22 is a light-transmitting substrate, for example, a transparent substrate. The sealing substrate 22 typically exhibits light transmittance to the light components of all wavelengths in the visible range. For example, the sealing substrate 22 is transparent to the light components of all wavelengths in the visible range. The sealing substrate 22 can be either colorless or colored.

The sealing substrate 22 is made of an insulating material such as glass, quartz, or a resin. A substrate made of a resin is normally more lightweight than a substrate made of glass or quartz. Using a resin allows to make the substrate flexible. The sealing substrate 22 can have either a single-layer structure or a multilayer structure.

The seal layer 23 intervenes between the array substrate 21 and the sealing substrate 22. The seal layer 23 has a frame shape and surrounds the organic EL elements OLED.

The seal layer 23 is a light-transmitting layer, for example, a transparent layer. The seal layer 23 typically exhibits light transmittance to the light components of all wavelengths in the visible range. For example, the seal layer 23 is transparent to the light components of all wavelengths in the visible range. The seal layer 23 can be either colorless or colored.

As the material of the seal layer 23, for example, a photosensitive resin such as a ultraviolet curable resin is usable. Another material such as frit may also be used as the material of the seal layer 23.

As shown in FIGS. 1 and 4, the optical adjustment layer 3 is a thin layer that covers the peripheral portion of the light-emitting portion 2 and a part of the light-transmitting layer 1 along the edge of the light-emitting portion 2. The third portion A3 is a portion of the light-emitting device WM that corresponds to the optical adjustment layer 3. The transmittances of the first portion A1 and the second portion A2 are defined as the first transmittance and the second transmittance, respectively. The optical adjustment layer 3 generates, in the third portion A3, a transmittance distribution in which the transmittance stepwisely decreases from the end on the side of the first portion A1 to the end on the side of the second portion A2 or a transmittance distribution in which the transmittance continuously decreases from the end on the side of the first portion A1 to the end on the side of the second portion A2 within the range from the first to second transmittances.

The optical adjustment layer 3 includes a polymer film, a printed layer, and an adhesive layer.

The polymer film is a light-transmitting film, for example, a transparent film. The polymer film typically exhibits light transmittance to the light components of all wavelengths in the visible range. For example, the polymer film is transparent to the light components of all wavelengths in the visible range. The polymer film can be either colorless or colored.

The polymer film is made of a resin such as polyethylene terephthalate, polyethylene naphthalate, polycarbonate, polymethylmethacrylate, cyclic polyolefin, aramid resin, or polystyrene. The polymer film can have either a single-layer structure or a multilayer structure.

The printed layer is provided on one major surface of the polymer film. When the polymer film has a multilayer structure, the printed layer may be provided between the layers of the polymer film.

The printed layer has a print pattern formed by, for example, arranging black halftone dots so that the density per unit area becomes higher on the side of the second portion A2 than on the side of the first portion A1. The print pattern may have a color other than black as long as it has light absorbance. The print pattern may be colorless as long as it has light reflectivity. Such a printed layer exhibits different transmittances on the side of the first portion A1 and on the side of the second portion A2.

The adhesive layer covers one major surface of the polymer film. The adhesive layer intervenes between the polymer film and the light-transmitting layer 1 and between the polymer film and the light-emitting portion 2.

The adhesive layer is a light-transmitting layer, for example, a transparent layer. The adhesive layer typically exhibits light transmittance to the light components of all wavelengths in the visible range. For example, the adhesive layer is transparent to the light components of all wavelengths in the visible range. The adhesive layer can be either colorless or colored.

The frame 4 includes, for example, an upper frame and a lower frame which are fitted each other. The upper and lower frames have opening portions that are located at the same position when the frames are fitted each other. The upper and lower frames of the frame 4 sandwich the peripheral portion of the light-transmitting layer 1 such that the central portion of the light-transmitting layer 1 is located at the above-described opening portions.

The upper and lower frames of the frame 4 also sandwich one of the edges of the light-emitting portion 2. When the frame 4 is opaque, employing the above-described structure allows the frame 4 to hide the peripheral circuits and OLB (Outer Lead Bonding) pads of the light-emitting portion 2, a flexible circuit board connected to the OLB pads, and the like.

The upper and lower frames of the frame 4 may sandwich two or three of the edges of the light-emitting portion 2. Alternatively, the upper and lower frames of the frame 4 need not always sandwich any one of the edges of the light-emitting portion 2.

The controller is installed in the frame 4. The controller controls at least one of the light-transmitting layer 1 and the light-emitting portion 2. The controller may be installed outside the frame 4. The light-emitting device WM need not include the controller.

The light-emitting device WM has an excellent visibility for a transmitted image. This will be described with reference to FIGS. 5 and 6.

Since the light-emitting portion 2 includes the anode 212 and the cathode 215, nonnegligible light absorption occurs in the second portion A2. For this reason, when, for example, the transmittance of the light-transmitting layer 1 is about 80%, and the transmittance of the display region of the light-emitting portion 2, that is, the region where the anode 212 and the cathode 215 are arranged is about 50%, the transmittance of the first portion A1 is about 80%, and the transmittance of the second portion A2 is about 40%.

Figure 6:
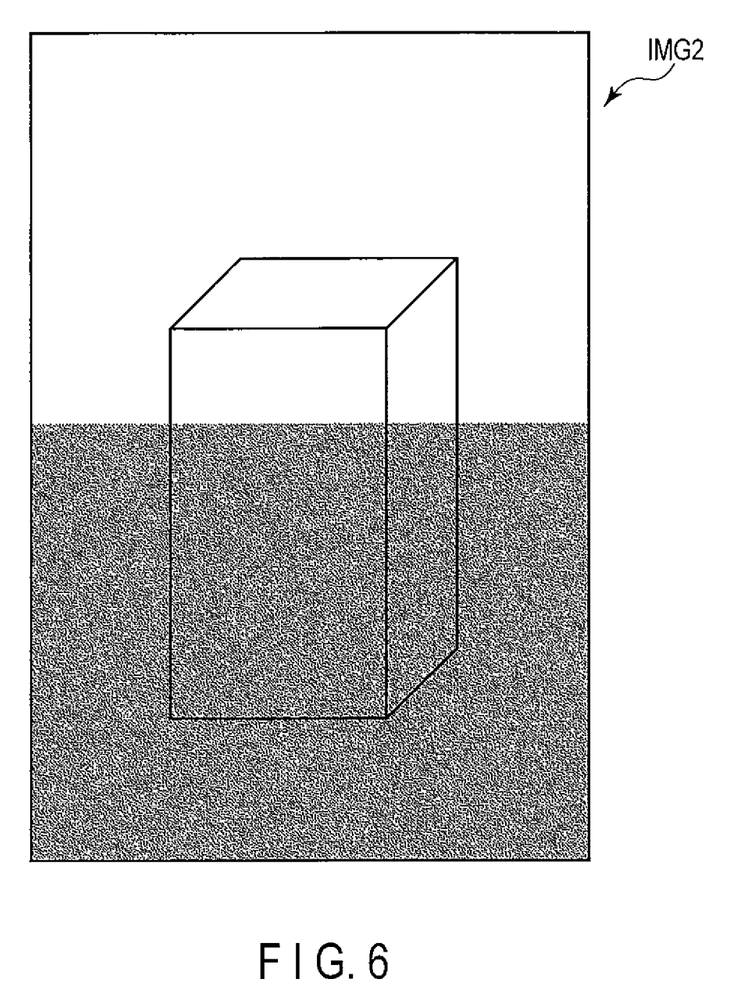
FIG. 6 is a view schematically showing an example of a transmitted image displayed on a light-emitting device according to a comparative example.

Hence, as shown in FIG. 6, in an image IMG2 observed through the light-emitting device WM including no optical adjustment layer 3, regions with largely different brightness levels are arranged adjacent in correspondence with the first portion A1 and the second portion A2. As a result, the image of the object located behind the light-emitting device WM looks overlapping the boundary line between the regions. The boundary line impedes visual recognition of the object located behind the light-emitting device WM.

Figure 5:
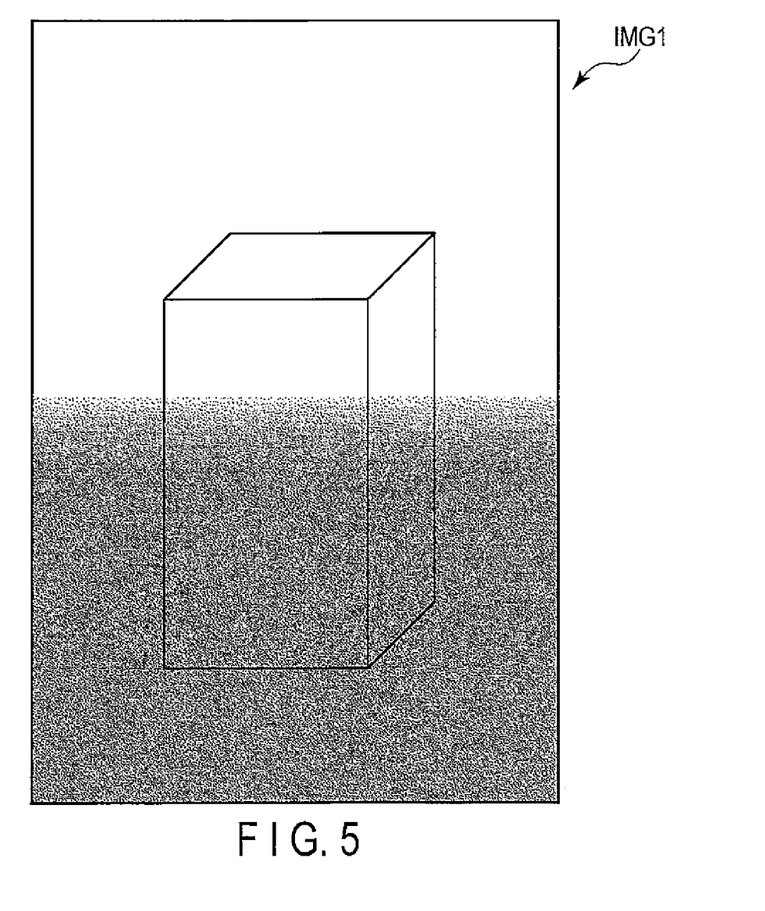
FIG. 5 is a view schematically showing an example of a transmitted image displayed on the light-emitting device shown in FIG. 1.

The light-emitting device WM described with reference to FIGS. 1 to 4 includes the optical adjustment layer 3. For this reason, as shown in FIG. 5, in an image IMG1 observed through the light-emitting device WM, a region where the brightness gradually decreases from the bright region to the dark region exists between the bright region and the dark region. That is, the optical adjustment layer 3 prevents the boundary line from being generated in the image observed through the light-emitting device WM or makes the boundary line in the image observed through the light-emitting device WM unnoticeable. Hence, the observer can observe the transmitted image with excellent visibility.

The light-emitting device WM uses, as the light-transmitting layer 1, a light control device capable of electrically controlling the transmittance. When the light-transmitting layer 1 is used, the image of the object located behind the light-emitting device WM is difficult to see, and as a result, the image displayed by the light-emitting portion 2 is easy to see.

Various modifications can be made on the light-emitting device WM.

For example, the light-emitting device WM may include a touch panel. The touch panel is installed to, for example, at least partially cover one or both of the light-transmitting layer 1 and the light-emitting portion 2.

As the light-transmitting layer 1, a switchable mirror device that can reversibly change between a transparent state and a light reflection state may be used in place of the electrochromic light control device described with reference to FIG. 2.

The switchable mirror device uses, for example, a hydride of a rare-earth metal such as yttrium or lanthanum, a hydride of an alloy of a rare-earth metal and magnesium or gadolinium, or a hydride of a magnesium nickel alloy. When the hydride is dehydrogenated, the state of the metal changes. The hydrogenation and dehydrogenation are used to cause the change between the transparent state and the light reflection state.

The hydrogenation and dehydrogenation can be done by an electrochromic method of moving hydrogen ions by voltage application and a gas chromic method of alternately exposing the material to hydrogen gas and oxygen gas. As an example of the switchable mirror device using the electrochromic method, an all-solid-state switchable mirror device using a magnesium nickel alloy thin film will be explained.

Figure 7:
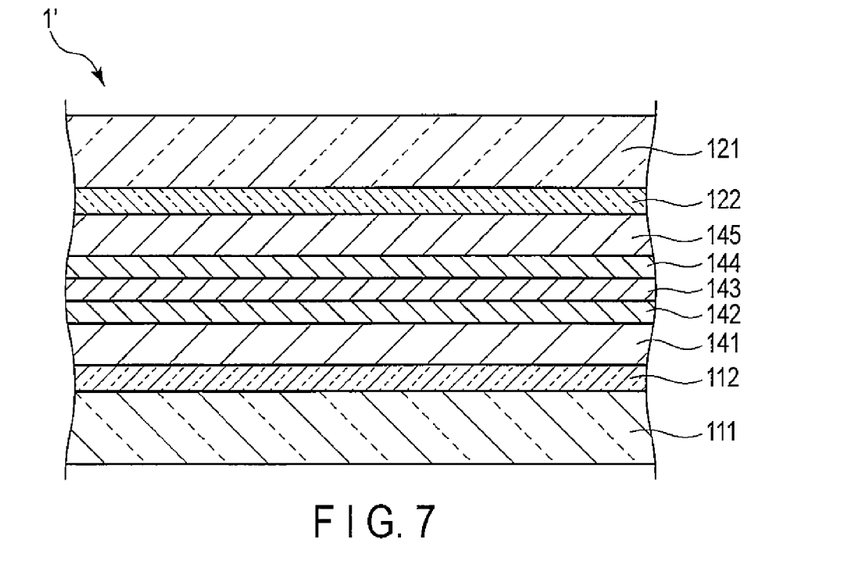
FIG. 7 is a sectional view schematically showing another example of the light-transmitting layer usable in the light-emitting device shown in FIG. 1.

A switchable mirror device 1' shown in FIG. 7 is an all-solid-state switchable mirror device. The switchable mirror device 1' includes substrates 111 and 121, electrodes 112 and 122, an ion storage layer 141, a solid electrolytic layer 142, a buffer layer 143, a catalytic layer 144, and an electrochromic layer 145.

The substrates 111 and 121 are, for example, transparent substrates made of glass, quartz, or a resin. The electrodes 112 and 122 are, for example, transparent electrodes made of ITO.

An optical variable layer intervenes between the electrodes 112 and 122. The optical variable layer includes the ion storage layer 141, the solid electrolytic layer 142, the buffer layer 143, the catalytic layer 144, and the electrochromic layer 145. The ion storage layer 141, the solid electrolytic layer 142, the buffer layer 143, the catalytic layer 144, and the electrochromic layer 145 are stacked in this order from the side of the electrode 112. The ion storage layer 141 contains, for example, $H_xWO_3$. The electrochromic layer 145 is made of, for example, a magnesium nickel alloy.

In the initial state, the switchable mirror device 1' has a mirror reflection property. When a voltage of about 5 V is applied between the electrodes 112 and 122, hydrogen ions ($H^+$) stored in the ion storage layer 141 move into the electrochromic layer 145, and the magnesium nickel alloy is hydrogenated to a nonmetal state. The switchable mirror device 1' thus changes from the mirror reflection state to the transparent state.

Next, the polarity of the voltage is inverted, and a voltage of about 5 V is applied between the electrodes 112 and 122, the hydrogen ions return from the electrochromic layer 145 to the ion storage layer ($WO_3$). The switchable mirror device 1' thus returns from the transparent state to the mirror reflection state.

Note that the transparent state and the mirror reflection state are maintained even after the voltage application has stopped.

When the switchable mirror device 1' is used in place of the electrochromic device described with reference to FIG. 2, and the light-emitting portion 2 is driven after setting the switchable mirror device 1' in the mirror reflection state, light emitted backward by the light-emitting portion 2 is also usable for display. That is, this enables brighter display.

As the light-transmitting layer 1, switchable light control glass utilizing a polymer-dispersed liquid crystal may be used in place of the electrochromic light control device described with reference to FIG. 2.

Figure 8:
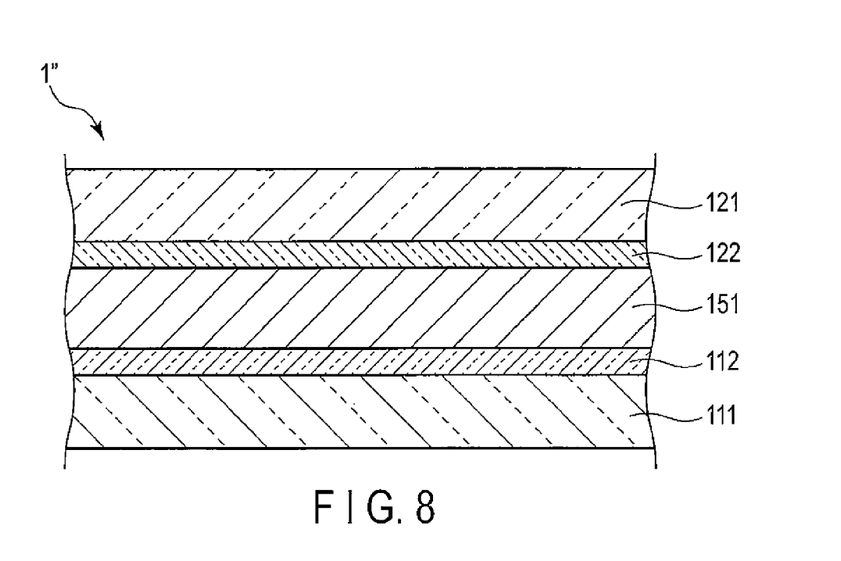
FIG. 8 is a sectional view schematically showing still another example of the light-transmitting layer usable in the light-emitting device shown in FIG. 1.

A switchable light control glass 1" shown in FIG. 8 includes substrates 111 and 121, electrodes 112 and 122, and a liquid crystal layer 151.

The substrates 111 and 121 are, for example, transparent substrates made of glass, quartz, or a resin. The electrodes 112 and 122 are, for example, transparent electrodes made of ITO.

The liquid crystal layer 151 intervenes between the electrodes 112 and 122. The liquid crystal layer 151 is an optical variable layer whose optical characteristic changes in accordance with the magnitude of the applied voltage. The liquid crystal layer 151 contains a matrix made of a polymer material and a liquid crystal material dispersed in it. The polymer material and the liquid crystal material are selected so as to have almost the same refractive index for light that travels in a direction perpendicular to the major surfaces of the substrates 111 and 121 when a voltage is applied between the electrodes 112 and 122.

Without voltage application between the electrodes 112 and 122, the switchable light control glass 1" causes refraction and reflection at the interface between the region made of the polymer material and the region made of the liquid crystal material. Hence, in this state, the switchable light control glass 1" looks white due to light-scattering.

When a voltage is applied between the electrodes 112 and 122, the refraction and reflection at the interface between the region made of the polymer material and the region made of the liquid crystal material decrease. Hence, in this state, the switchable light control glass 1" is transparent.

Note that when a dichromatic dye is mixed into the liquid crystal material, a reversible change can occur between a colored light-scattering state and a transparent state.

When the switchable light control glass 1" is used in place of the electrochromic light control device described with reference to FIG. 2, the transmittance can be changed more quickly. In this case, when the switchable light control glass 1" changes to the light-scattering state, the image of the object located behind the light-emitting device WM is almost completely invisible.

The above-described light-transmitting layer 1 having the light control function may have the light control function all over the regions corresponding to the first portion A1, the second portion A2, and the third portion A3 or in only a part of the regions. From the viewpoint of the visibility of the image displayed by the light-emitting portion 2, the light-transmitting layer 1 preferably has the light control function at least in the region corresponding to the second portion A2.

A material incapable of electrically controlling the transmittance may be used as the light-transmitting layer 1. For such a light-transmitting layer 1, for example, a glass plate, a quartz plate, a resin plate, or a resin film is usable. The light-transmitting layer 1 can have either a single-layer structure or a multilayer structure.

As the light-emitting portion 2, another light-emitting portion may be used in place of the organic EL device. For example, a liquid crystal display device including a light-emitting diode (LED) as a light source of a backlight may be used. Alternatively, a device including an LED serving as a light source and a waveguide for guiding light emitted by the LED may be used. Otherwise, a device formed by arranging LEDs in a matrix may be used. However, from the viewpoint of the transmittance and resolution, an organic EL device is preferably used.

In the above-described light-emitting device WM, the optical adjustment layer 3 generates the transmittance distribution in the third portion A3. The transmittance distribution can also be generated by another method.

For example, one of the light control devices 1, 1', and 1" described with reference to FIGS. 2, 7, and 8 is used as the light-transmitting layer 1, and the optical adjustment layer 3 is removed from the light-emitting device WM. At least one of the electrodes 112 and 122 is divided by a plurality of grooves each running along the outline of the second portion A2 and located in the third portion A3. For example, the electrode 112 is divided by a plurality of grooves located in the third portion A3. A plurality of strip-shaped electrodes are thus formed in the third portion. The potential of each strip-shaped electrode can independently be set from the remaining portions of the electrode 112. Adopting this structure and appropriately setting voltage application between the electrodes 112 and 122 in the third portion A3, for example, appropriately setting the potential of each strip-shaped electrode allow to generate the same transmittance distribution in the third portion A3 as in the case using the optical adjustment layer 3.

The optical adjustment layer 3 may be omitted, and its function may be imparted to the seal layer 23. For example, the seal layer 23 may contain light-absorbing or light-reflecting particles such that the density of the particles decreases from the side of the second portion A2 to the side of the first portion A1.

When viewed in the direction perpendicular to the major surface of the light-transmitting layer 1, the display region of the light-emitting portion 2 may be adjacent to the optical adjustment layer 3 or apart from the optical adjustment layer 3. The distance between the display region and the optical adjustment layer 3 when viewed in the direction perpendicular to the major surface of the light-transmitting layer 1 is preferably 1 cm or less, and more preferably, 0.5 cm or less.

The appropriate width of the third portion A3, that is, the appropriate distance between the first portion A1 and the second portion A2 changes depending on the distance between the observer and the light-emitting device WM. For example, when the distance between the observer and the light-emitting device WM is 50 cm or less, the width of the third portion A3 preferably falls within the range of 1 to 3 cm. When the distance between the observer and the light-emitting device WM is 50 cm to 2 m, the width of the third portion A3 preferably falls within the range of 2 to 5 cm. When the distance between the observer and the light-emitting device WM is 2 to 5 m, the width of the third portion A3 preferably falls within the range of 4 to 10 cm.

Note that the value to be assumed as the distance between the observer and the light-emitting device WM changes depending on the dimensions or use environment of the light-emitting device WM. For example, when the light-emitting device WM is used on a window provided on a wall of a building or a private home, the value to be assumed as the distance between the observer and the light-emitting device WM is 2 to 5 m. When the light-emitting device WM is used on a window provided on a partition or door of a building or a private home, the value to be assumed as the distance between the observer and the light-emitting device WM is 50 cm to 2 m. When the light-emitting device WM is used on a window of a train or a car, the value to be assumed as the distance between the observer and the light-emitting device WM is 50 cm or less.

The third portion A3 may have a transmittance distribution in which the transmittance continuously decreases from the end on the side of the first portion A1 to the end on the side of the second portion A2 or a transmittance distribution in which the transmittance stepwisely decreases from the end on the side of the first portion A1 to the end on the side of the second portion A2. In the latter case, the third portion A3 preferably includes three or more regions having transmittances that are different from each other and are lower than that of the first portion A1 and higher than that of the second portion A2. More preferably, the third portion A3 includes five or more such regions.

In a state in which the light-transmitting layer 1 and the light-emitting portion 2 are separated apart from each other, one major surface of each of them is set to a first temperature, and the other major surface is set to a second temperature different from the first temperature. In this case, the warp amount per unit length of the light-transmitting layer 1 is preferably smaller than that of the light-emitting portion 2. For example, out of the two major surfaces of the light-transmitting layer 1, the major surface that should face the light-emitting portion 2 is set to the first temperature, and the major surface on the opposite side is set to the second temperature. Out of the two major surfaces of the light-emitting portion 2, the major surface that should face the light-transmitting layer 1 is set to the second temperature, and the major surface on the opposite side is set to the first temperature. In this case, the warp amount per unit length of the light-transmitting layer 1 is preferably smaller than that of the light-emitting portion 2. This condition is preferably satisfied in at least one of a case in which the second temperature is lower than the first temperature and a case in which the second temperature is higher than the first temperature. More preferably, the condition is satisfied in both cases. Note that, for example, the first temperature is 25° C., and the second temperature is 5° C.

When used on a window of a vehicle or a building, the light-emitting device WM is exposed to the temperature difference between indoor and outdoor. The light-transmitting layer 1 is preferably used outdoors and is therefore exposed to a larger temperature difference. Hence, the light-emitting device WM that adopts the above-described arrangement does not largely warp even if the temperature difference between indoor and outdoor is large, and can therefore achieve a long life.

In a state in which the light-transmitting layer 1 and the light-emitting portion 2 are separated apart from each other, each of them is placed on a frame smaller than the light-emitting portion 2 and pressed downward at the center of the opening of the frame. In this case, the warp amount per unit length of the light-transmitting layer 1 is preferably smaller than that of the light-emitting portion 2.

When used on a window of a vehicle or a building, the light-emitting device WM is exposed to the pressure difference between indoor and outdoor caused due to wind or the like. The light-transmitting layer 1 is preferably used outdoors and is therefore exposed to a larger pressure difference. Hence, the light-emitting device WM that adopts the above-described arrangement does not largely warp even if the pressure difference between indoor and outdoor is large, and can therefore achieve a long life.

When the light-emitting portion 2 is adhered to the light-transmitting layer 1, an elastic layer having rubber-like elasticity and light transmittance is preferably used as the adhesive layer intervening between them. Such an elastic layer can relax the stress at the interface between the light-transmitting layer 1 and the light-emitting portion 2.

The second embodiment will be desired next. A light-emitting device according to the second embodiment is the same as the light-emitting device according to the first embodiment except that the following structure is adopted. This will be described below with reference to FIG. 9.

Figure 9:
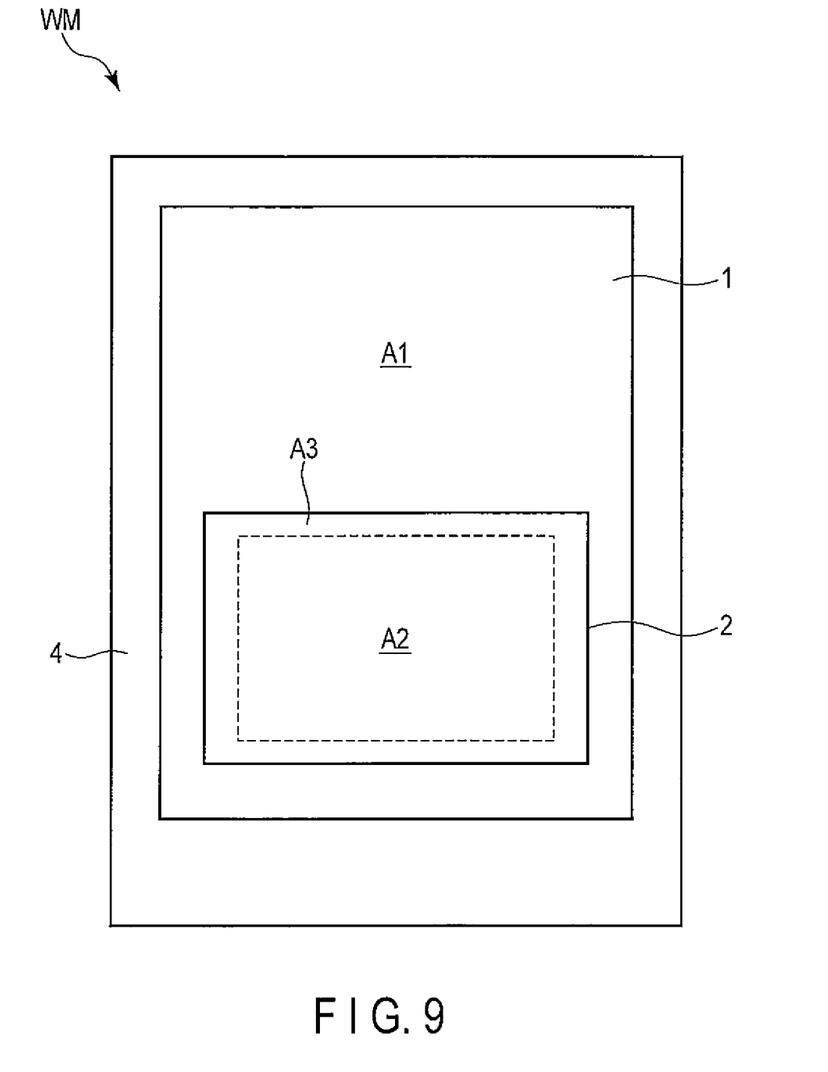
FIG. 9 is a plan view schematically showing a light-emitting device according to the second embodiment.

In a light-emitting device WM shown in FIG. 9, a light-transmitting layer 1 can electrically control the transmittance. The light-transmitting layer 1 is, for example, one of the light control devices 1, 1', and 1" described with reference to FIGS. 2, 7, and 8.

The light-transmitting layer 1 includes a first region and a second region surrounded by it. The first and second regions are adjacent to each other. The area of the first region is larger than that of the second region. A light-emitting portion 2 is adhered to the second region.

Note that the first region is the region of the light-transmitting layer 1 that does not overlap the light-emitting portion 2. The second region is the region of the light-transmitting layer 1 that overlaps the light-emitting portion 2. A first portion A1 is the portion of the light-emitting device WM that corresponds to the first region or a part of the portion. A second portion A2 is the portion of the light-emitting device WM that corresponds to the center portion of the second region. A third portion A3 is the portion of the light-emitting device WM that corresponds to the peripheral portion of the second region. The second portion A2 and the third portion A3 correspond to the display region or the light-emitting region of the light-emitting portion 2 and the peripheral region of the light-emitting portion 2, respectively. The third portion A3 may have the transmittance distribution described in the first embodiment or not.

The light-emitting portion 2 may overlap only the region having the light control function, that is, the light control region of the light-transmitting layer 1. Alternatively, the light-emitting portion 2 may overlap the light control region and the peripheral region surrounding it.

Note that the light-emitting device WM includes, on the light-transmitting layer 1, an interconnection (not shown) that connects the light-emitting portion 2 to the controller.

When used on a window of a vehicle or a building, the light-emitting device WM is exposed to the temperature difference between indoor and outdoor or the pressure difference between indoor and outdoor caused due to wind or the like. For example, when an upper frame and a lower frame sandwich the edge of the light-emitting portion 2, and the light-emitting device WM deforms due to the above-described temperature difference or pressure difference, the light-emitting portion 2 may be damaged.

When the above-described structure is adopted, for example, the light-emitting portion 2 can be spaced part from a frame 4. It is therefore possible to achieve a long life.

More detailed examples of the above-described structure will be described below.

EXAMPLE 1

Manufacture of a light-emitting device WM that is almost the same as that described with reference to FIGS. 1, 2, 3, and 4 will be explained. Note that the frame 4 is omitted here.

More specifically, when manufacturing an electrochromic light control device 1, glass substrates are used as substrates 111 and 121, and ITO layers are formed as electrodes 112 and 122. An amorphous film of $WO_3$ is formed as an electrochromic layer 140 by radio frequency (RF) magnetron sputtering.

An electrolytic layer 130 is formed by the following method. First, a frame-shaped adhesive layer is formed on the surface of the substrate 111 with the electrode 112. Then, the substrates 111 and 121 are overlaid such that the electrode 112 faces the electrochromic layer 140, and the adhesive is cured. An empty cell is thus obtained. After that, an aqueous lithium chloride solution is injected into the empty cell, and the inlet is sealed. The electrolytic layer 130 made of the aqueous lithium chloride solution is thus obtained.

The electrochromic light control device 1 obtained in the above-described way exhibits transmittance of 70% to 80% in the transparent state.

As a light-emitting portion 2, an organic EL display device is used.

As a substrate 211, a polyethylene terephthalate film is used. Circuits including thin-film transistors and the like and anodes 212 made of ITO are formed on the substrate 211. A partition insulating layer 213 made of a resin is also formed.

Next, a hole injection layer 214H made of a mixture of poly(3,4-ethylenedioxythiophene) (PEDOT) and polystyrene sulfonate (PSS) and blue, green, and red light-emitting layers 214A are sequentially formed on the anodes 212 by the inkjet method. An alloy of silver and magnesium is deposited on an active layer 214 including the hole injection layer 214H and the light-emitting layers 214A to obtain a cathode 215. The cathode 215 is formed into stripes in correspondence with the columns of the anodes 212 such that the light-emitting portion 2 become transparent.

A polyethylene terephthalate film with a gas barrier film formed on one major surface is laminated onto the cathode 215, and the periphery of the thus obtained structure is sealed using a transparent epoxy resin.

The display region of the organic EL display device 2 obtained in the above-described way exhibits transmittance of 25% to 30% in the non-light-emitting state.

The organic EL display device 2 is bonded to the electrochromic light control device 1 via a transparent rubber sheet having elasticity.

An optical adjustment layer 3 is prepared by distributing black toner on a polyethylene terephthalate ribbon by electrophotography. The optical adjustment layer 3 is bonded to the electrochromic light control device 1 and the organic EL display device 2 via a transparent adhesive.

In the thus obtained light-emitting device WM, a transmitted image is observed while setting the electrochromic light control device 1 in the transparent state and the organic EL display device 2 in the non-light-emitting state. As a result, the transmitted image can be observed with excellent visibility.

COMPARATIVE EXAMPLE 1

A light-emitting device is manufactured, which is the same as that of Example 1 except that the optical adjustment layer 3 is omitted. In the thus obtained light-emitting device, a transmitted image is observed while setting the electrochromic light control device 1 in the transparent state and the organic EL display device 2 in the non-light-emitting state. As a result, the boundary line between the regions with largely different brightness levels overlaps the transmitted image, and the transmitted image can not be observed with excellent visibility.

EXAMPLE 2

As an light-transmitting layer 1, smoked glass having transmittance of 50% is used instead of the electrochromic light control device 1. A light-emitting device WM that is the same as in Example 1 except the above-described point is manufactured. In the thus obtained light-emitting device WM, a transmitted image is observed while setting an organic EL display device 2 in the non-light-emitting state. As a result, the transmitted image can be observed with excellent visibility.

COMPARATIVE EXAMPLE 2

A light-emitting device is manufactured, which is the same as that of Example 2 except that the optical adjustment layer 3 is omitted. In the thus obtained light-emitting device, a transmitted image is observed while setting the organic EL display device 2 in the non-light-emitting state. As a result, the boundary line between the regions with largely different brightness levels overlaps the transmitted image, and the transmitted image can not be observed with excellent visibility.

EXAMPLE 3

A light-emitting device WM that is almost the same as that described with reference to FIGS. 1, 2, 3, and 4 is manufactured. The frame 4 is omitted here. Switchable light control glass 1" shown in FIG. 8 is used in place of an electrochromic light control device 1.

More specifically, when manufacturing the switchable light control glass 1", glass substrates are used as substrates 111 and 121, and ITO layers are formed as electrodes 112 and 122.

A liquid crystal layer 151 is formed by the following method.

First, a frame-shaped adhesive layer is formed on the surface of the substrate 111 with the electrode 112. Then, the substrates 111 and 121 are overlaid such that the electrodes 112 and 122 face each other, and the adhesive is cured. An empty cell is thus created. After that, a mixture of a fluorine-based liquid crystal material, an acrylic monomer, and a polymerization initiator is injected into the empty cell, and the inlet is sealed. In this state, polymerization is caused to obtain the polymer-dispersed liquid crystal layer 151.

The switchable light control glass 1" obtained in the above-described way exhibits transmittance of 60% to 70% upon voltage application, that is, in the transparent state.

As a light-emitting portion 2, an organic EL display device is used.

As a substrate 211, a polyethylene terephthalate film is used. Circuits including thin-film transistors and the like and anodes 212 made of ITO are formed on the substrate 211. A partition insulating layer 213 made of a resin is also formed. Next, a hole injection layer 214H made of a mixture of PEDOT and PSS and blue, green, and red light-emitting layers 214A are sequentially formed on the anodes 212 by the inkjet method.

A polyethylene terephthalate film having, as a cathode 215 on one major surface, a graphene thin film substituted with nitrogen atoms is laminated onto an active layer 214 including the hole injection layer 214H and the light-emitting layers 214A such that the graphene thin film comes into contact with the active layer 214. Note that the nitrogen-substituted graphene thin film is obtained by forming a graphene thin film on a copper foil by thermal chemical vapor deposition (CVD) using ammonia, methane, and hydrogen as raw materials, transferring the graphene thin film from the copper foil to the polyethylene terephthalate film, and adhering silver nanoparticles or silver nanowires.

After that, the periphery of the thus obtained structure is sealed using a transparent epoxy resin.

The display region of the organic EL display device 2 obtained in the above-described way exhibits transmittance of 40% to 50% in the non-light-emitting state.

The thus obtained switchable light control glass 1" is used in place of the electrochromic light control device 1. As the light-emitting portion 2, the organic EL display device 2 is used. The light-emitting device WM that is the same as that manufactured in Example 1 except the above-described points is manufactured.

In the thus obtained light-emitting device WM, a transmitted image is observed while setting the switchable light control glass 1" in the transparent state and the organic EL display device 2 in the non-light-emitting state. As a result, the transmitted image can be observed with excellent visibility.

COMPARATIVE EXAMPLE 3

A light-emitting device is manufactured, which is the same as that of Example 3 except that the optical adjustment layer 3 is omitted. In the thus obtained light-emitting device, a transmitted image is observed while setting the switchable light control glass 1" in the transparent state and the organic EL display device 2 in the non-light-emitting state. As a result, the boundary line between the regions with largely different brightness levels overlaps the transmitted image, and the transmitted image can not be observed with excellent visibility.

EXAMPLE 4

A light-emitting device WM is manufactured, which is almost the same as that of Example 3 except that the position of an organic EL display device 2 relative to a switchable light control glass 1" is changed as described with reference to FIG. 9, and the optical adjustment layer 3 is omitted. In this case, the structure formed by bonding the switchable light control glass 1" and the organic EL display device 2 is supported by a frame 4 made of a metal.

The thus obtained light-emitting device WM is lightweight and hard to deform even when a temperature difference and a pressure difference are applied between the major surfaces.

COMPARATIVE EXAMPLE 4

A light-emitting device is manufactured, which is the same as that of Example 4 except that the switchable light control glass 1" and the organic EL display device 2 have the same dimensions. When a temperature difference is applied between the major surfaces of the thus obtained light-emitting device, display failures occur at a high frequency within a relatively short period near the edge of the organic EL display device 2.

EXAMPLE 5

An organic EL display device 2 is manufactured, which is the same as that of Example 1 except that a mixture of an epoxy resin and a black pigment is used for sealing in place of a transparent epoxy resin. The ratio of the black pigment in the mixture is decreased from the center to the edge of the organic EL display device 2.

A light-emitting device WM is manufactured, which is the same as that of Example 1 except that the organic EL display device 2 is used as a light-emitting portion 2, an optical adjustment layer 3 is omitted, and an electrochromic light control device 1 is bonded to the organic EL display device 2 via a transparent adhesive layer in place of a rubber sheet.

In the thus obtained light-emitting device WM, a transmitted image is observed while setting the electrochromic light control device 1 in the transparent state and the organic EL display device 2 in the non-light-emitting state. As a result, the transmitted image can be observed with excellent visibility.

COMPARATIVE EXAMPLE 5

A light-emitting device is manufactured, which is the same as that of Example 5 except that a transparent epoxy resin is used for sealing in place of the mixture of an epoxy resin and a black pigment. In the thus obtained light-emitting device, a transmitted image is observed while setting the electrochromic light control device 1 in the transparent state and the organic EL display device 2 in the non-light-emitting state. As a result, the boundary line between the regions with largely different brightness levels overlaps the transmitted image, and the transmitted image can not be observed with excellent visibility.

EXAMPLE 6

A light-emitting device is manufactured, which is the same as that of Example 1 except that the optical adjustment layer 3 is omitted, and an electrochromic light control device 1 adopts the following structure. That is, in this case, an electrode 112 of the electrochromic light control device 1 is patterned, in a third portion A3, into five strip-shaped electrodes each having a shape conforming to the outline of a second portion A2.

In a thus obtained light-emitting device WM, the electrochromic light control device 1 is driven such that a high transmittance was exhibited in a first portion A1 and the second portion A2, and the transmittance is decreased in the third portion A3 from the side of the first portion A1 to the side of the second portion A2. In addition, a transmitted image is observed while setting the organic EL display device 2 in the non-light-emitting state. As a result, the transmitted image can be observed with excellent visibility.

COMPARATIVE EXAMPLE 6

A light-emitting device is manufactured, which is the same as that of Example 6 except that the electrode 112 is not patterned. That is, the same light-emitting device as in Comparative Example 1 is manufactured.

In the thus obtained light-emitting device, a transmitted image is observed while setting the electrochromic light control device 1 in the transparent state and the organic EL display device 2 in the non-light-emitting state. As a result, the boundary line between the regions with largely different brightness levels overlaps the transmitted image, and the transmitted image can not be observed with excellent visibility.

EXAMPLE 7

A light-emitting device WM is manufactured, which is almost the same as that described with reference to FIGS. 1, 2, 3, and 4. The frame 4 is omitted. A switchable mirror device 1' shown in FIG. 7 is used in place of the electrochromic light control device 1.

More specifically, when manufacturing the switchable mirror device 1', a glass substrate is prepared as a substrate 111. An ITO layer is formed on the substrate 111 as an electrode 112. Next, an ion storage layer 141, a solid electrolytic layer 142, a buffer layer 143, a catalytic layer 144, an electrochromic layer 145, and an electrode 122 are formed in this order on the electrode 112 at room temperature using a magnetron sputtering apparatus. As the ion storage layer 141, a $WO_3$ layer is formed. As the solid electrolytic layer 142, a $Ta_2O_3$ layer is formed. As the buffer layer 143, an aluminum layer is formed. As the catalytic layer 144, a palladium layer is formed. As the electrochromic layer 145, a magnesium nickel alloy layer is formed. As the electrode 122, ITO is formed. After that, the substrate 111 and a substrate 121 made of glass are overlaid to sandwich the above-described layers, and the structure is sealed.

The switchable mirror device 1' obtained in the above-described way exhibits transmittance of 50% to 60% in the transparent state.

As a light-emitting portion 2, an organic EL display device is manufactured.

As a substrate 211, a polycarbonate film is used. Circuits including thin-film transistors and the like and anodes 212 made of ITO are formed on the substrate 211. A partition insulating layer 213 made of a resin is also formed. Next, a hole injection layer 214H made of a mixture of PEDOT and PSS and blue, green, and red light-emitting layers 214A are sequentially formed on the anodes 212 by the inkjet method.

A polycarbonate film having, as a cathode 215 on one major surface, an unsubstituted graphene thin film doped with polyethylene imine is laminated onto an active layer 214 including the hole injection layer 214H and the light-emitting layers 214A such that the graphene thin film comes into contact with the active layer 214. Note that the unsubstituted graphene thin film is obtained by forming a graphene thin film on a copper foil by thermal CVD using methane and hydrogen as raw materials and transferring the graphene thin film from the copper foil to the polycarbonate film with the polyethylene imine thin film.

After that, the periphery of the thus obtained structure is sealed using a transparent epoxy resin.

The display region of the organic EL display device 2 obtained in the above-described way exhibits transmittance of 40% to 50% in the non-light-emitting state.

The thus obtained switchable mirror device 1' is used in place of the electrochromic light control device 1. As the light-emitting portion 2, the organic EL display device 2 is used. The light-emitting device WM that is the same as that manufactured in Example 1 except the above-described points is manufactured.

In the thus obtained light-emitting device WM, a transmitted image is observed while setting the switchable mirror device 1' in the transparent state and the organic EL display device 2 in the non-light-emitting state. As a result, the transmitted image can be observed with excellent visibility.

COMPARATIVE EXAMPLE 7

A light-emitting device is manufactured, which is the same as that of Example 7 except that the optical adjustment layer 3 is omitted. In the thus obtained light-emitting device, a transmitted image is observed while setting the switchable mirror device 1' in the transparent state and the organic EL display device 2 in the non-light-emitting state. As a result, the boundary line between the regions with largely different brightness levels overlaps the transmitted image, and the transmitted image can not be observed with excellent visibility.

EXAMPLE 8

A light-emitting device WM is manufactured, which is the same as that of Example 7 except that the following organic EL display device 2 is used.

When manufacturing the organic EL display device 2, a polyethylene terephthalate film is prepared as a substrate 211. Circuits including thin-film transistors and the like and anodes 212 made of boron-substituted graphene are formed on the substrate 211. A partition insulating layer 213 made of a resin is also formed. The anodes 212 made of boron-substituted graphene are obtained by forming a graphene thin film on a copper foil by thermal CVD using diborane, methane, and hydrogen as raw materials and transferring the graphene thin film from the copper foil to the polyethylene terephthalate film. Next, a photoresist is applied to the graphene, and the photoresist is exposed with light in a predetermined pattern and then developed. Unnecessary portions of the graphene film are removed by etching using oxygen plasma. In addition, the residual resist is removed using a solvent to obtain the anode pixel electrodes 212. The partition insulating layer 213 is formed by applying a photosensitive resin, exposing it with light in a predetermined pattern and developing it to remove the resin on the graphene, and heating and curing the resin. Next, a hole injection layer 214H made of a mixture of PEDOT and PSS and blue, green, and red light-emitting layers 214A are sequentially formed on the anodes 212 by the inkjet method.

A polyethylene terephthalate film having, as a cathode 215 on one major surface, an unsubstituted graphene thin film doped with polyethylene imine is laminated onto an active layer 214 including the hole injection layer 214H and the light-emitting layers 214A such that the graphene thin film comes into contact with the active layer 214.

After that, the periphery of the thus obtained structure is sealed using a transparent epoxy resin.

The display region of the organic EL display device 2 obtained in the above-described way exhibits transmittance of 40% to 50% in the non-light-emitting state.

The light-emitting device WM is manufactured, which is the same as that of Example 7 except that the light-emitting portion 2 obtained in the above-described way is used.

In the thus obtained light-emitting device WM, a transmitted image is observed while setting the switchable mirror device 1' in the transparent state and the organic EL display device 2 in the non-light-emitting state. As a result, the transmitted image can be observed with excellent visibility.

COMPARATIVE EXAMPLE 8

A light-emitting device is manufactured, which is the same as that of Example 8 except that the optical adjustment layer 3 is omitted. In the thus obtained light-emitting device, a transmitted image is observed while setting the switchable mirror device 1' in the transparent state and the organic EL display device 2 in the non-light-emitting state. As a result, the boundary line between the regions with largely different brightness levels overlaps the transmitted image, and the transmitted image can not be observed with excellent visibility.

EXAMPLE 9

A light-emitting device WM is manufactured, which is the same as that of Example 1 except that the following electrochromic light control device 1 is used.

When manufacturing the electrochromic light control device 1, glass substrates are used as substrates 111 and 121, and unsubstituted graphene layers are formed as electrodes 112 and 122. An amorphous film of $WO_3$ is formed as an electrochromic layer 140 by RF magnetron sputtering.

An electrolytic layer 130 is formed by the following method.

First, a frame-shaped adhesive layer is formed on the surface of the substrate 111 with the electrode 112. Then, the substrates 111 and 121 are overlaid such that the electrode 112 faces the electrochromic layer 140, and the adhesive is cured. An empty cell is thus obtained. After that, an aqueous lithium chloride solution is injected into the empty cell, and the inlet is sealed. The electrolytic layer 130 made of the aqueous lithium chloride solution is thus obtained.

The electrochromic light control device 1 obtained in the above-described way exhibits transmittance of 70% to 80% in the transparent state.

The light-emitting device WM is manufactured, which is the same as that of Example 1 except that the electrochromic light control device 1 obtained in the above-described way is used.

In the thus obtained light-emitting device WM, a transmitted image is observed while setting the electrochromic light control device 1 in the transparent state and an organic EL display device 2 in the non-light-emitting state. As a result, the transmitted image can be observed with excellent visibility.

COMPARATIVE EXAMPLE 9

A light-emitting device is manufactured, which is the same as that of Example 9 except that the optical adjustment layer 3 is omitted. In the thus obtained light-emitting device, a transmitted image is observed while setting the electrochromic light control device 1 in the transparent state and the organic EL display device 2 in the non-light-emitting state. As a result, the boundary line between the regions with largely different brightness levels overlaps the transmitted image, and the transmitted image can not be observed with excellent visibility.

EXAMPLE 10

A light-emitting device WM is manufactured, which is the same as that of Example 7 except that the following organic EL display device 2 is used in place of an organic EL display device 2.

When manufacturing the organic EL display device 2, a polyethylene terephthalate film is prepared as a substrate 211. Interconnections and anodes 212 made of boron-substituted graphene are formed on the substrate 211. A hole injection layer 214H is formed on the anodes 212 by applying a mixture of PEDOT and PSS. A white light-emitting layer 214A is further formed on it.

A polyethylene terephthalate film having, as a cathode 215 on one major surface, an unsubstituted graphene thin film doped with polyethylene imine is laminated onto an active layer 214 including the hole injection layer 214H and the light-emitting layer 214A such that the graphene thin film comes into contact with the active layer 214.

After that, the periphery of the thus obtained structure is sealed using a transparent epoxy resin.

The display region of the organic EL display device 2 obtained in the above-described way exhibits transmittance of 60% to 70% in the non-light-emitting state.

The light-emitting device WM is manufactured, which was the same as that of Example 7 except that the organic EL display device 2 obtained in the above-described way is used.

In the thus obtained light-emitting device WM, a transmitted image is observed while setting a switchable mirror device 1' in the transparent state and the organic EL display device 2 in the non-light-emitting state. As a result, the transmitted image can be observed with excellent visibility.

COMPARATIVE EXAMPLE 10

A light-emitting device is manufactured, which is the same as that of Example 10 except that the optical adjustment layer 3 is omitted. In the thus obtained light-emitting device, a transmitted image is observed while setting the switchable mirror device 1' in the transparent state and the organic EL display device 2 in the non-light-emitting state. As a result, the boundary line between the regions with largely different brightness levels overlaps the transmitted image, and the transmitted image can not be observed with excellent visibility.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light-emitting device comprising:
a light-transmitting layer including first and second regions and a third region intervening therebetween; and
a light-emitting portion overlapping the second region or the second and third regions,
wherein a first portion of the light-emitting device that corresponds to the first region transmits light having a certain wavelength in a visible range at a first transmittance,
a second portion of the light-emitting device that corresponds to the second region causes light emission by the light-emitting portion and transmits the light having the wavelength at a second transmittance lower than the first transmittance, and
a third portion of the light-emitting device that corresponds to the third region is configured to have transmittance distribution in which transmittance for the light having the wavelength decreases from an end on a side of the first portion to an end on a side of the second portion within a range from the first transmittance to the second transmittance.

2. The device according to claim 1, wherein the light-transmitting layer comprises:
first and second substrates facing each other;
an optical variable layer intervening between the first and second substrates and causing an optical characteristic change thereof in accordance with a magnitude of an applied voltage;
one or more first electrodes intervening between the first and second substrates; and
a second electrode intervening between the first and second substrates and applying the voltage to the optical variable layer together with said one or more first electrodes, and
wherein the device is configured to, in at least a part of the light-transmitting layer, change the transmittance for light having a certain wavelength in the visible range in accordance with the magnitude and/or a direction of the voltage applied between the second electrode and each of said one or more first electrodes.

3. The device according to claim 2, wherein the light-transmitting layer is configured to change the transmittance of the third region for the light having the wavelength in accordance with the magnitude and/or the direction of the voltage applied between the second electrode and at least one of the first electrode(s), and
wherein the light-emitting device is configured to control voltage application between the second electrode and at least one of the first electrode(s) such that the transmittance of the third region for the light having the wavelength decreases from the end on the side of the first portion to the end on the side of the second portion within the range from the first transmittance to the second transmittance.

4. The device according to claim 3, wherein the light-emitting portion comprises:
third and fourth substrates facing each other;
a seal layer intervening between the third and fourth substrates and having a frame shape; and
one or more light-emitting elements located in a space surrounded by the third and fourth substrates and the seal layer, and
wherein said one or more light-emitting elements are located in the second portion, and the seal layer is located in the third portion.

5. The device according to claim 2, further comprising an optical adjustment layer located in the third portion and having a transmittance distribution in which the transmittance for the light having the wavelength decreases from the end on the side of the first portion to the end on the side of the second portion within the range from the first transmittance to the second transmittance.

6. The device according to claim 5, wherein the light-emitting portion comprises:
third and fourth substrates facing each other;
a seal layer intervening between the third and fourth substrates and having a frame shape; and
one or more light-emitting elements located in a space surrounded by the third and fourth substrates and the seal layer, and
wherein said one or more light-emitting elements are located in the second portion, and the seal layer is located in the third portion.

7. The device according to claim 2, wherein the light-emitting portion comprises:
third and fourth substrates facing each other;
a seal layer intervening between the third and fourth substrates and having a frame shape; and
one or more light-emitting elements located in a space surrounded by the third and fourth substrates and the seal layer, and
wherein said one or more light-emitting elements are located in the second portion, and the seal layer is located in the third portion.

8. The device according to claim 1, further comprising an optical adjustment layer located in the third portion and having a transmittance distribution in which the transmittance for the light having the wavelength decreases from the end on the side of the first portion to the end on the side of the second portion within the range from the first transmittance to the second transmittance.

9. The device according to claim 1, wherein the light-emitting portion comprises:
third and fourth substrates facing each other;
a seal layer intervening between the third and fourth substrates and having a frame shape; and
one or more light-emitting elements located in a space surrounded by the third and fourth substrates and the seal layer, and
wherein said one or more light-emitting elements are located in the second portion, and the seal layer is located in the third portion.

10. The device according to claim 1, wherein in a state in which the light-transmitting layer and the light-emitting portion are separated away from each other, when one major surface of each of the light-transmitting layer and the light-emitting portion is set to a first temperature, and the other major surface is set to a second temperature different from the first temperature, a warp amount per unit length of the light-transmitting layer is smaller than that of the light-emitting portion.

11. The device according to claim 1, wherein at least one of the light-transmitting layer and the light-emitting portion comprises a transparent electrode made of nitrogen- or boron-substituted graphene or unsubstituted graphene.

12. The device according to claim 1, further comprising an elastic layer between the second region and the light-emitting portion, the elastic layer having rubber-like elasticity and transmitting the light having the wavelength.

13. A light-emitting device comprising:
a light-transmitting layer including a first region and a second region surrounded by the first region, the first region having an area larger than that of the second region, the light-transmitting layer comprising first and second substrates facing each other, an optical variable layer intervening between the first substrate and the second substrate and causing an optical characteristic change thereof in accordance with a magnitude of an applied voltage, one or more first electrodes intervening between the first substrate and the second substrate, and a second electrode intervening between the first and second substrates and applying the voltage to the optical variable layer together with said one or more first electrodes, and the light-transmitting layer being configured to, in at least a part thereof, change transmittance for light having a certain wavelength in a visible range in accordance with the magnitude and/or a direction of the voltage applied between the second electrode and each of said one or more first electrodes; and a light-emitting portion adhered to the second region and transmitting the light having the wavelength.

14. The device according to claim 13, wherein the light-transmitting layer further includes a third region intervening between the first and second regions, a first portion of the light-emitting device that corresponds to the first region transmits light having a certain wavelength in the visible range at a first transmittance, a second portion of the light-emitting device that corresponds to the second region causes light emission by the light-emitting portion and transmits the light having the wavelength at a second transmittance lower than the first transmittance, and a third portion of the light-emitting device that corresponds to the third region is configured to have a transmittance distribution in which the transmittance for the light having the wavelength decreases from an end on a side of the first portion to an end on a side of the second portion within a range from the first transmittance to the second transmittance.

15. The device according to claim 13, wherein in a state in which the light-transmitting layer and the light-emitting portion are separated away from each other, when one major surface of each of the light-transmitting layer and the light-emitting portion is set to a first temperature, and the other major surface is set to a second temperature different from the first temperature, a warp amount per unit length of the light-transmitting layer is smaller than that of the light-emitting portion.

16. The device according to claim 13, wherein at least one of the light-transmitting layer and the light-emitting portion comprises a transparent electrode made of nitrogen- or boron-substituted graphene or unsubstituted graphene.

17. The device according to claim 13, further comprising an elastic layer between the second region and the light-emitting portion, the elastic layer having rubber-like elasticity and transmitting the light having the wavelength.

* * * * *